United States Patent [19]
Chang et al.

[11] Patent Number: 5,330,585
[45] Date of Patent: Jul. 19, 1994

[54] GALLIUM ARSENIDE/ALUMINUM GALLIUM ARSENIDE PHOTOCELL INCLUDING ENVIRONMENTALLY SEALED OHMIC CONTACT GRID INTERFACE AND METHOD OF FABRICATING THE CELL

[75] Inventors: Kou-I Chang, Yorba Linda; Bruce T. Cavicchi, North Hollywood, both of Calif.

[73] Assignee: Spectrolab, Inc., Sylmar, Calif.

[21] Appl. No.: 968,778

[22] Filed: Oct. 30, 1992

[51] Int. Cl.$^5$ ...................... H01L 31/04; H01L 31/18
[52] U.S. Cl. .................................. 136/256; 136/262; 257/434; 257/459; 257/773; 437/2; 437/5; 437/184
[58] Field of Search ................ 136/256, 262; 257/434, 257/459, 773; 437/2–5, 184

[56] References Cited

U.S. PATENT DOCUMENTS

| | | |
|---|---|---|
| 4,725,559 | 2/1988 | Fraas ........................... 437/5 |
| 5,075,763 | 12/1991 | Spitzer et al. .................. 257/751 |

FOREIGN PATENT DOCUMENTS 2219689 12/1989 United Kingdom ................ 136/255

OTHER PUBLICATIONS

S. P. Tobin et al., *Solar Cells*, vol. 24, pp. 103–115 (May/Jun. 1988).
H. F. MacMillan et al., *Conference Record, 20th IEEE Photovoltaic Specialists Conf.*, Sep. 1988, pp. 462–468.
M. R. Melloch et al., *Conference Record, 21st IEEE Photovoltaic Specialists Conf.*, May 1990, pp. 163–167.
26% Efficient Magnesium–Doped AlGaAs/GaAs Concentrator Solar Cells, by H. Hamaker et al., Proceedings of 18th Photovoltaic Specialists Conference, IEEE 1985, pp. 327–331.
J. C. Chen et al., "Effects of Metalorganic Chemical Vapor Deposition Growth Conditions on the GaAs/Ge Solar Cell Properties", Applied Physics Letters, vol. 58, No. 20, May 20, 1991, New York, pp. 2282–2284.

*Primary Examiner*—Aaron Weisstuch
*Attorney, Agent, or Firm*—Elizabeth E. Leitereg; Terje Gudmestad; W. K. Denson-Low

[57] ABSTRACT

A photocell (40) includes a photovoltaic or otherwise photosensitive layer structure (44) on which a passivation or window layer (52) of an environmentally sensitive material such as aluminum gallium arsenide (Al-GaAs) and an antireflection (AR) coating (54) are formed. An electrically conductive cap layer (60) delineated in a front contact grid configuration sealingly extends through the AR coating (54) to the window layer (52). An ohmic metal contact (64) is evaporated over and seals the cap layer (60) and the contiguous areas of the AR coating (54). The contact grid interface at which the cap layer (60) contacts the window layer (52) is sealed by the AR coating (54) and the contact (64). The photocell (40) is fabricated by forming, delineating and etching the cap layer (60), forming the AR coating (54) and then forming the contact (64) by evaporation of metal.

13 Claims, 3 Drawing Sheets

GALLIUM ARSENIDE/ALUMINUM GALLIUM ARSENIDE PHOTOCELL INCLUDING ENVIRONMENTALLY SEALED OHMIC CONTACT GRID INTERFACE AND METHOD OF FABRICATING THE CELL

BACKGROUND OF THE INVENTION

1. Field of the Invention

The present invention generally relates to photoelectric devices, particularly gallium arsenide (GaAs) photovoltaic cells, and more specifically to a photosensitive cell including an environmentally sealed ohmic contact grid interface.

2. Description of the Related Art

Photovoltaic or solar cells including GaAs photosensitive semiconductor layer structures formed on germanium (Ge) substrates are preferred over silicon (Si) based cells due to their higher efficiency in converting light to electricity. A GaAs/Ge solar cell generally includes an aluminum gallium arsenide (AlGaAs) passivation or "window" layer formed over the photosensitive layer structure, and an oxide antireflection (AR) coating formed over the window layer.

GaAs/Ge solar cells are generally classified into two types according to the configuration of their ohmic metal front contact collection grids. The most common is referred to as an etch-through contact, in which front contact patterns are etched through the window layer to expose the underlying GaAs emitter layer of the photosensitive layer structure. Front metals are evaporated and plated directly onto the emitter layer through the etched openings to form the front contact grid. This arrangement is disadvantageous in that, upon exposure to high temperatures such as those experienced in welding, the contact metal can diffuse into the junction of the cell and degrade the performance.

The second type of contact configuration utilizes a cap layer of highly doped, and therefore electrically conductive GaAs to separate the contact metal from the junction of the cell. The cap layer is formed over the entire window layer. A silicon dioxide mask is then formed over the cap layer except in the areas of the contact grid lines. The contact metal is then plated onto the unmasked portions of the cap layer. The silicon dioxide mask is removed, and the cap layer is etched away to expose the window layer except under the contact grid lines. The AR coating is then deposited over the window layer.

The cap layer provides low contact resistance and physically separates the contact metal from the cell junction. The conventional method of fabricating a solar cell including a cap layer is described in an article entitled "26% EFFICIENT MAGNESIUM-DOPED AlGaAs/GaAs CONCENTRATOR SOLAR CELLS" by H Hamaker et all, in Proceedings of 18th Photovoltaic Specialists Conference, IEEE 1985, pp. 327-331. First, a front contact was formed, and then the GaAs cap layer was etched to reveal the AlAgAs window layer. Finally, the AR coatings were deposited.

A representative section of a GaAs/Ge solar photocell 10 having a cap layer configuration fabricated using the prior art method described above is illustrated in FIG. 1. The cell 10 includes an N+doped Ge substrate 12, and a photosensitive GaAs P/N junction layer structure 14 grown on the substrate 12. The structure 14 includes an N+ doped GaAs buffer layer 16, an N-doped GaAs base layer 18 and a P− doped GaAs emitter layer 20. An AlGaAs passivation or window layer 22 is deposited on the emitter layer 20. An oxide AR coating 24 is deposited on the window layer 22. An ohmic metal back contact layer 26 is formed on the surface of the substrate 12 opposite the layer structure 14.

The cell 10 further includes a front ohmic contact collection grid including structures 28 which extend perpendicular to the plane of the drawing in FIG. 1. Only one front contact structure 28 which is illustrated includes a GaAs cap layer 30 extending through an opening 32 in the AR coating 24 to contact the window layer 22. An ohmic metal contact 34 is formed on the cap layer 30.

Light incident on the front of the AR coating 24 causes liberation of electron-hole pairs in the photosensitive layer structure 14 due to the photovoltaic effect. The electrons and holes flow out of the layer structure 14 to an external load (not shown) through the cap layer 30 and front contact 34, and the back contact layer 26 respectively.

The front contact 34 includes a thick layer 34a of silver (Ag) which is plated over the cap layer 30 and a thin gold (Au) layer 34b which is plated over the silver layer 34a. The contact 34 is wider than the cap layer 30. More specifically, the contact 34 has overhangs 34c and 34d on the opposite lateral sides thereof which overlie pockets or hollows 32a and 32b defined between the cap layer 30 and the respective inner walls of the opening 32.

Due to the prior art fabrication process of the cell 10 as described above, the overhangs 34c and 34d are created during the plating step which forms the contact 34. More specifically, a silicon dioxide plating mask (not shown) is formed over the cap layer 30 to cover all but the portion illustrated in FIG. 1. The Ag and Au layers 34a and 34b which form the contact 34 are plated not only onto the exposed upper surface of the cap layer 30, but grow laterally onto the adjacent edge portions of the mask.

The hollows 32a and 32b are created by etching the silicon dioxide plating mask and by etching the cap layer 30 external of the contact 34 to expose the window layer 22. The hollows 32a and 32b are shadowed by the overhangs 34c and 34d of the plated front contact 34 during subsequent evaporation of the AR coating 24, such that the coating 24 extends only to the edges of the overhangs 34c and 34d and the hollows 32a and 32b remain. The AlGaAs window layer 22 in the hollows 32a and 32b is not sealed by the AR coating 24.

AlGaAs corrodes upon exposure to moisture and oxygen. The contact grid interface including the contact 34, cap layer 30 and AlGaAs window layer 22 is environmentally sensitive in that the window layer 22 is directly exposed to the environment in the hollows 32a and 32b. Moisture is able to enter the hollows 32a and 32b and corrode the exposed portions of the window layer 22, thereby reducing the photo-generated current of the cell 10 and degrading its electrical performance.

The hollows 32a and 32b are enlarged during the step of etching the GaAs cap layer 30 to the shape illustrated in FIG. 1. The etchant used to etch the GaAs cap layer 30 also reacts with the Ag layer 34a in the front contact 34. The Au layer 34b is formed on the Ag layer 34a of the contact 34 to protect it from being etched. However, the Au layer 34b on the lower surfaces of the overhangs 34c and 34d is non-uniform and much thinner than on the upper surface of the Ag layer 34a due to the nature of the plating process. This enables the etchant to etch the Ag layer 34a under the overhangs 34c and 34d and thereby enlarge the hollows 32a and 32b.

SUMMARY OF THE INVENTION

A photocell embodying the present invention includes a photovoltaic or otherwise photosensitive layer structure on which a passivation or window layer formed of an environmentally sensitive material such as aluminum gallium arsenide (AlGaAs) and an antireflection (AR) coating are formed.

An electrically conductive cap layer delineated in a front contact collection grid configuration sealingly extends through the AR coating to the window layer. An ohmic metal contact is evaporated over and seals the cap layer and the contiguous areas of the AR coating. The contact grid interface at which the cap layer contacts the window layer is sealed by the AR coating and the ohmic metal.

The present photocell is fabricated by forming the window layer over the photosensitive layer structure, and then forming the cap layer of an environmentally insensitive, electrically conductive material over the window layer. A portion of the cap layer on the active area is removed to expose the underlying window layer such that a second portion of the cap layer, which is delineated in the contact grid configuration, remains over the window layer.

The antireflection coating of an environmentally insensitive, electrically insulative material is then formed over the exposed portion of the window layer such that the second portion of the cap layer sealingly extends through the coating. The ohmic contact of an electrically conductive material is then evaporated onto the second portion of the cap layer.

The present invention provides a number of advantages over the prior art. The environmentally sensitive window layer is completely sealed, especially at the interface with the cap layer which is exposed as described above with the prior art process. The window layer is thereby protected from corrosion upon exposure to moisture and oxygen.

Etching of the cap layer is performed before metallization. Chemical reaction between the etchant and the ohmic contact metal, particularly the Ag layer, is eliminated. This enables more consistent and uniform cap layer etching which provides greater control of the window layer thickness and composition, increased short circuit current and cell environmental stability.

The shunt resistance of the present photocell whose front contacts are formed by evaporation is higher than that of the prior art cell with plated contacts. Shunt paths on crystalline defects formed while the part is immersed in the plating solution in the prior art are eliminated by the invention.

The present photocell can withstand substantially greater thermal treatments without degradation since the contact metal is separated from the photosensitive layer structure by the cap layer and the contiguous portions of the AR coating which are overlapped by the contact metal. The present contact configuration is amenable to welded assembly techniques in which highly localized temperatures can exceed 600° C. for up to 0.5 second.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 2:
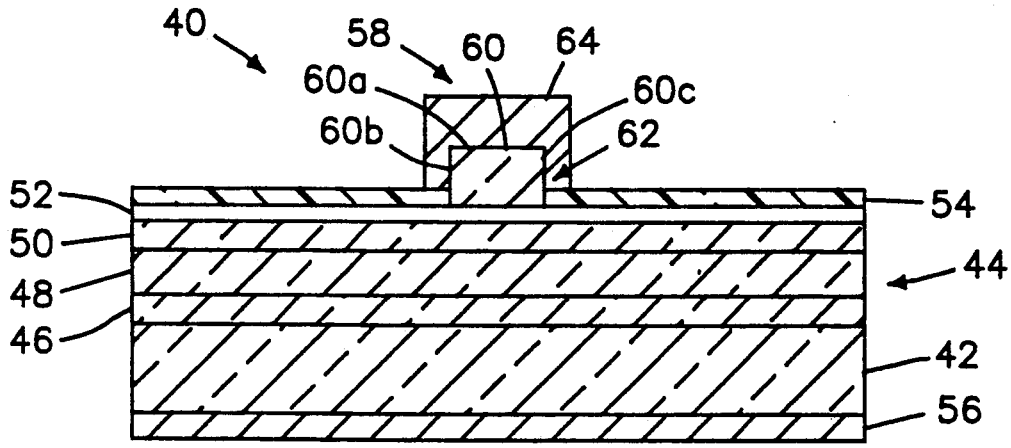
FIG. 2 is similar to FIG. 1 but illustrates a photovoltaic or solar photocell fabricated by a method embodying the present invention.

A photocell 40 embodying the present invention is illustrated in FIG. 2 and includes a heavily doped N-type Ge substrate 42, and a photosensitive semiconductor layer structure 44 formed on the substrate 42. The structure 44 includes a heavily doped N-type GaAs buffer layer 46, an N-type GaAs base layer 48 and a heavily doped P-type GaAs emitter layer 50. An AlGaAs passivation or window layer 52 is formed on the emitter layer 50.

An electrically insulative antireflection coating 54 is deposited on the window layer 52. The coating 54 consists of sublayers of tantalum oxide ($Ta_2O_5$) and aluminum oxide ($Al_2O_3$). An ohmic metal back contact layer 56 is formed on the lower or back surface of the substrate 42 opposite the upper or front surface on which the layer structure 44 is formed.

The cell 40 further includes a front ohmic contact collection grid including a plurality of parallel linear ohmic contact structures 58 which extend perpendicular to the plane of the drawing. FIG. 2 illustrates only one contact structure 58 which includes a P+ doped and thereby electrically conductive GaAs cap layer 60 which extends through an opening 62 in the AR coating 54 into contact with the window layer 52. An ohmic metal contact 64 is formed on the cap layer 60. Although not explicitly illustrated, the contact 64 is preferably a multilayer structure including, for example, layers of titanium (Ti), Au, and Ag.

Light incident on the front of the AR coating 54 causes liberation of electron-hole pairs in the photosensitive layer structure 44 due to the photovoltaic effect. The electrons and holes flow out of the layer structure 44 to an external load (not shown) through the cap layer 60 and front contact 64, and the back contact layer 56 respectively.

Figure 1:
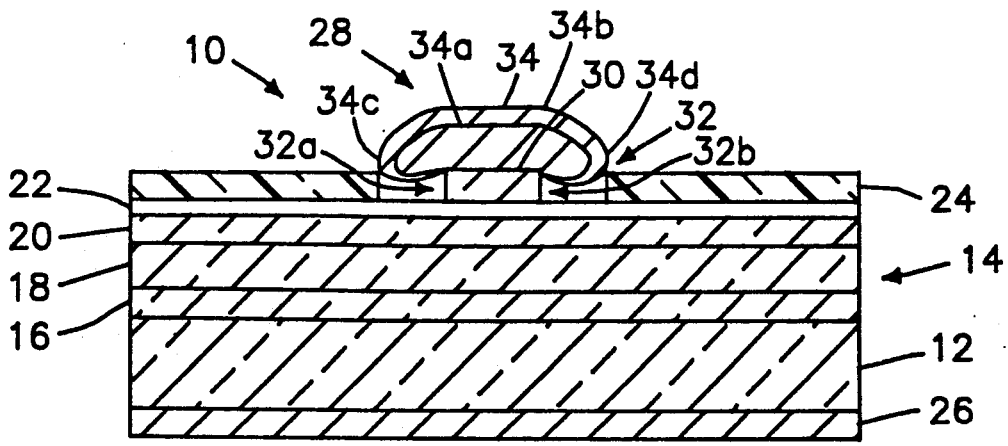
FIG. 1 is a sectional view illustrating a prior art photovoltaic or solar photocell fabricated by a prior method.

The window layer 52 is formed of AlGaAs, which is thereby environmentally sensitive as described above with reference to FIG. 1. However, the entire window layer 52 is sealed in accordance with the present invention, and protected from corrosion which could result from exposure to moisture and oxygen.

The cap layer 60 sealingly extends through the opening 62 in the AR coating 54. Since the coating 54 is an oxide, it is environmentally insensitive. The GaAs cap layer 60 is also environmentally insensitive. Thus, the window layer 52 is sealingly encapsulated by the AR coating 54 and the cap layer 60, especially at the interface of the coating 54 and layer 60.

The sealing of the window layer 52 is enhanced by the configuration of the ohmic metal contact 64. More specifically, the cap layer 60 has a top surface 60a and peripheral walls 60b and 60c which extend above the AR coating 54. The contact 64 sealingly adheres to the top surface 60a and peripheral walls 60b and 60c of the cap layer 60, and also to the contiguous portions of the AR coating 54. The overlap of the contact 64 onto the AR coating 54 provides a second seal for the window layer 52.

The environmentally sensitive window layer 52 is completely sealed and protected from ambient moisture and oxygen in accordance with the present invention. This enables the present photocell 40 to operate indefinitely in humid environments which would degrade the performance of the prior art photocell described with reference to FIG. 1. The shunt resistance of the photocell 40 is desirably higher than that of the prior art photocell.

Although the present photocell has been described and illustrated as being a photovoltaic or solar cell, the scope of the invention is not so limited. The invention is equally applicable to any photoelectric device including a photosensitive layer structure which produces a useful effect in response to incident light, an environmentally sensitive layer formed over the photosensitive layer structure, and an ohmic contact which interfaces with the environmentally sensitive layer. Examples of such devices include photoresistors, photodiodes and phototransistors.

Figure 3:
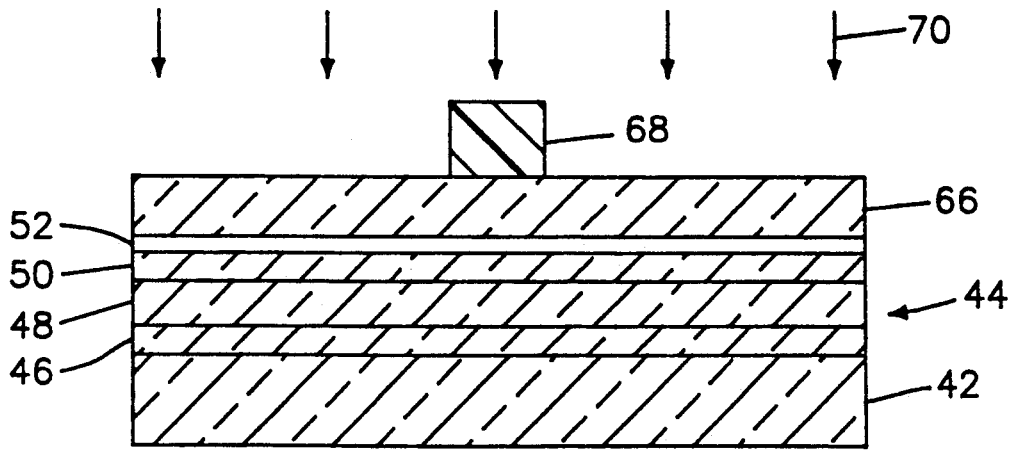
FIGS. 3 to 8 are sectional views illustrating the method of fabricating the photocell illustrated in FIG. 2.

A method of fabricating the photocell 40 in accordance with the present invention is illustrated in FIGS. 3 to 8. In FIG. 3, the photosensitive layer structure 44 and window layer 52 are formed on the substrate 42, preferably using metal organic chemical vapor deposition (MOCVD), in a known manner. A cap layer 66 is formed over the entire window layer 52, also using MOCVD, to a thickness of preferably 5,000 angstroms.

A photoresist mask 68 is formed over the portions of the cap layer 66 which correspond to the front contact grid lines. The mask 68 is conventionally formed by coating the entire cap layer 66 with photoresist, exposing the grid line portions using photolithography, and developing the photoresist to dissolve away the unexposed portions to produce the configuration illustrated in FIG. 3.

Figure 4:
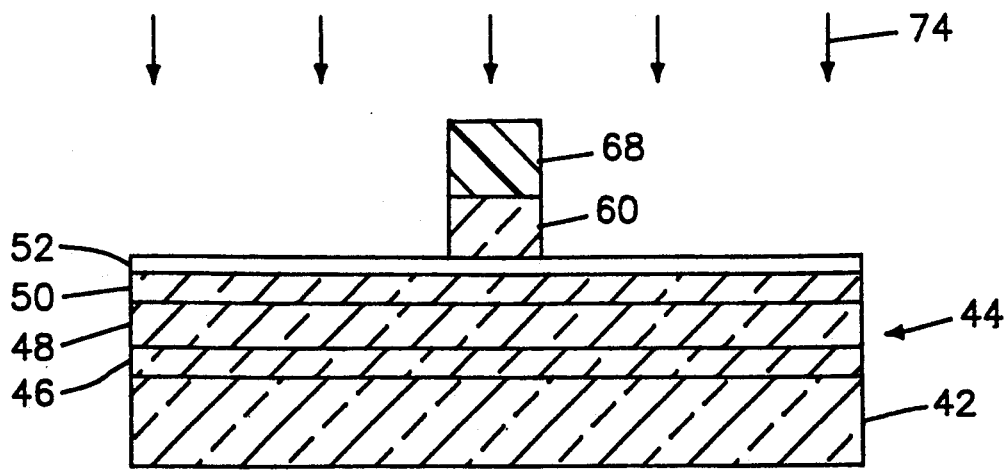

The portions of the cap layer 66 which are not covered by the mask 68 are etched away as indicated by arrows 70 in FIG. 3 to expose the underlying window layer 52 as illustrated in FIG. 4. The etched cap layer has the shape illustrated in FIG. 2 and is re-designated as 60. The structure is then subjected to deep ultraviolet exposure to polymerize and stabilize the surface of the photoresist layer 68.

Figure 5:
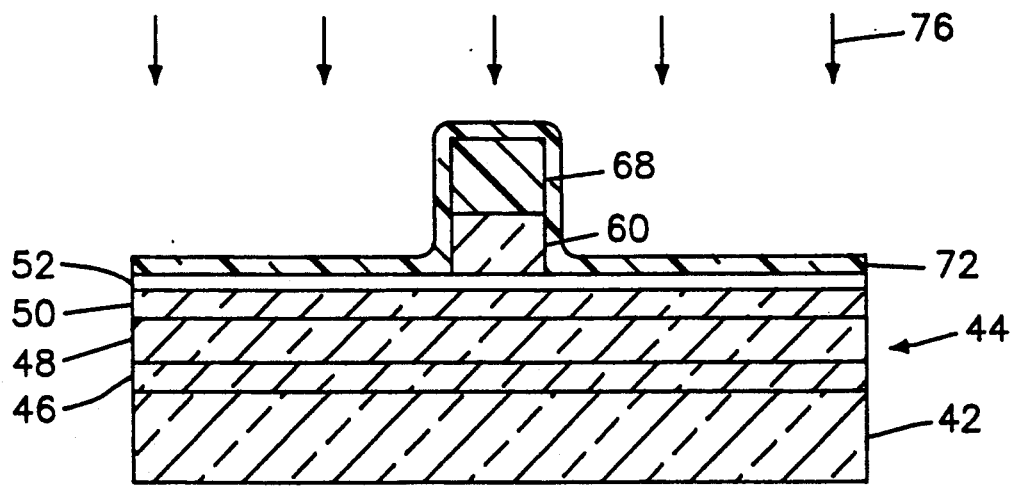
Figure 6:
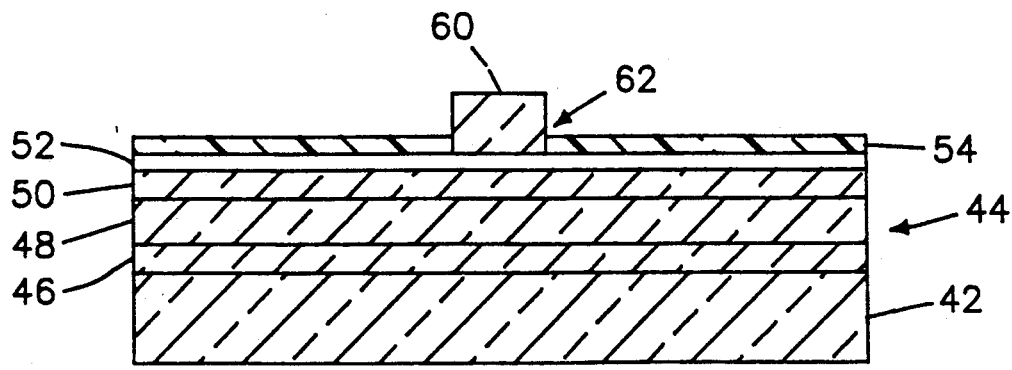

An AR coating 72 is evaporated onto the entire structure to a preferred thickness of 1,500 angstroms as indicated by arrows 74 in FIG. 4 to produce the configuration illustrated in FIG. 5. Then, the structure is immersed in acetone as indicated by arrows 76 to lift off the photoresist mask 68 and overlying AR coating 72 from the cap layer 60 to produce the configuration illustrated in FIG. 6. The cap layer 60 sealingly extends through the AR coating which is re-designated as 54.

Figure 7:
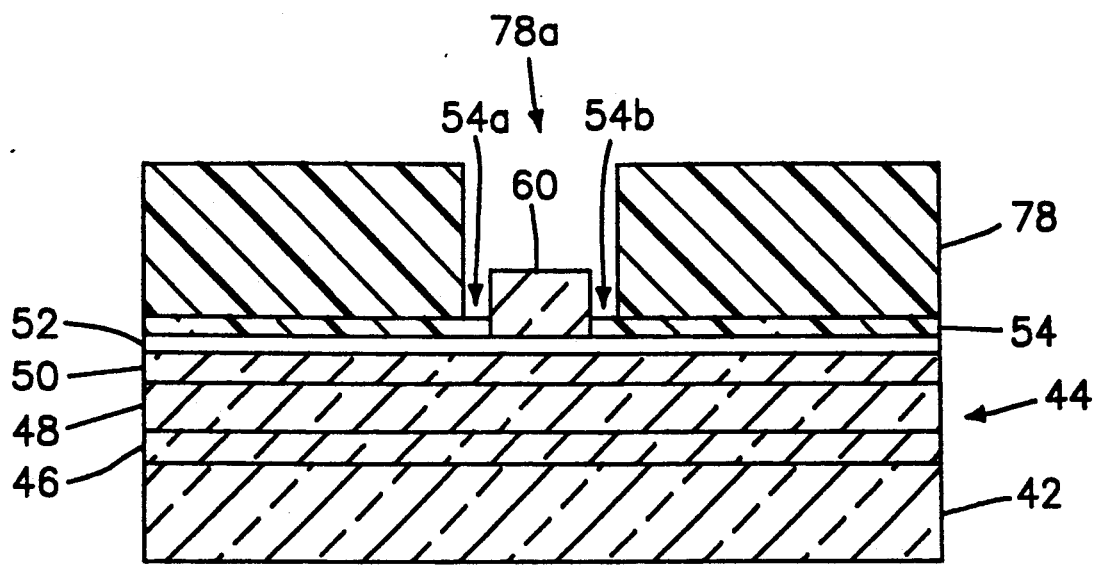
Figure 8:
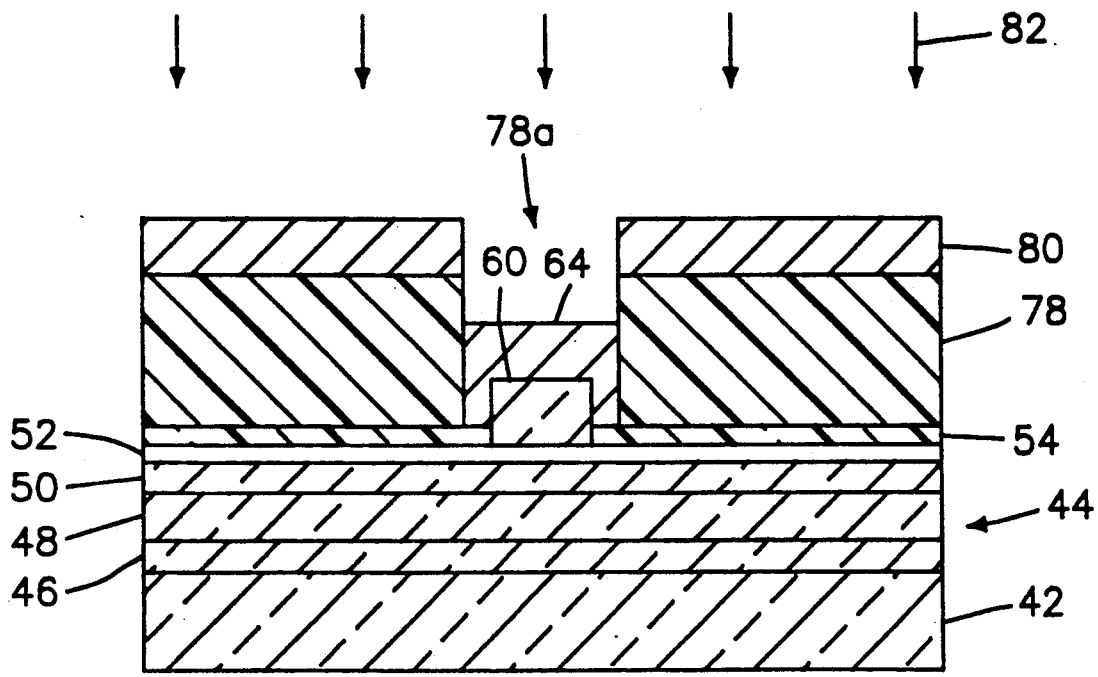

A photoresist mask 78 is formed on the exposed portions of the antireflection coating 54 using conventional photolithography to a thickness of approximately 6 micrometers as illustrated in FIG. 7. The mask 78 has openings 78a which expose the cap layer 60 and contiguous portions 54a and 54b of the antireflection coating 54. Then, ohmic metal 80 is evaporated onto the entire structure as illustrated in FIG. 8. The metal which sealingly adheres to the cap layer 60 and portions 54a and 54b of the coating 54 constitute the contact 64. The structure is immersed in photoresist remover to lift off the mask 78 and overlying metal 80. The back contact layer 56 is then evaporated onto the surface of the substrate 42 opposite to the surface on which the layer structure 44 is formed to produce the photocell 40 illustrated in FIG. 2.

While an illustrative embodiment of the invention has been shown and described, numerous variations and alternate embodiments will occur to those skilled in the art, without departing from the spirit and scope of the invention. Accordingly, it is intended that the present invention not be limited solely to the specifically described illustrative embodiment. Various modifications are contemplated and can be made without departing from the spirit and scope of the invention as defined by the appended claims.

We claim:

1. A photosensitive cell; comprising:
   a photosensitive layer structure;
   a passivation layer of a environmentally sensitive material which is formed over the photosensitive layer structure;
   a cap layer of an environmentally insensitive, electrically conductive material which is formed over a portion of the passivation layer;
   an antireflection coating of an environmentally insensitive, electrically insulative material which is formed over the passivation layer such that the cap layer extends through the coating and, together with the coating, seals the passivation layer; and
   an ohmic contact formed over the cap layer,
   wherein the cap layer includes a top surface and a peripheral wall which are external of the passivation layer; and the ohmic contact sealingly adheres to said top surface and said peripheral wall of the cap layer and a portion of the antireflection coating which is contiguous with said peripheral wall.

2. A photosensitive cell as in claim 1, in which:
   the photosensitive layer structure is configured to produce a photovoltaic effect;
   the passivation layer is formed over a first surface of the photosensitive layer structure; and
   the cell further comprises another ohmic contact which electrically communicates with a second surface of the photosensitive layer structure which is opposite to said first surface.

3. A photosensitive cell as in claim 1, in which:
   the photosensitive layer structure is formed of gallium arsenide; and
   the passivation layer is transparent and formed of aluminum gallium arsenide.

4. A photosensitive cell as in claim 3, further comprising a germanium substrate over which the photosensitive layer structure is formed.

5. A photosensitive cell as in claim 4, in which:
   the photosensitive layer structure is configured to produce a photovoltaic effect;
   the photosensitive layer structure is formed over a first surface of the substrate; and
   the cell further comprises another ohmic contact formed over a second surface of the substrate which is opposite to said first surface.

6. A photosensitive cell as in claim 3, in which the cap layer is formed of heavily doped gallium arsenide and ohmically communicates with the passivation layer.

7. A photosensitive cell as in claim 6, in which the antireflection coating is formed of an oxide.

8. A photosensitive cell as in claim 1, in which the antireflection coating directly contacts the periphery of the cap layer.

9. A semiconductor structure, comprising:
- a first layer of an environmentally sensitive, semiconductor material;
- a second layer of an environmentally insensitive, electrically conductive material which is formed over and ohmically communicates with a portion of the first layer;
- a third layer of an environmentally insensitive, electrically insulative material which is formed over the first layer such that the second layer sealingly extends through the third layer; and
- an ohmic contact which sealingly adheres to the second layer and a portion of the third layer which is contiguous with the second layer.

10. A structure as in claim 9, in which:
- the first layer is formed of aluminum gallium arsenide;
- the second layer is formed of heavily doped gallium arsenide; and
- the third layer is formed of an oxide.

11. A method of fabricating a photosensitive cell, comprising the steps of:
- (a) forming a photosensitive layer structure;
- (b) forming a passivation layer of an environmentally sensitive material over the photosensitive layer structure;
- (c) forming a cap layer of an environmentally insensitive, electrically conductive material over the passivation layer;
- (d) removing a first portion of the cap layer to expose an underlying portion of the passivation layer such that a second portion of the cap layer remains over the passivation layer;
- (e) forming an antireflection coating of an environmentally insensitive, electrically insulative material over said exposed portion of the passivation layer such that said second portion of the cap layer extends through the coating and, with the coating and second portion of the cap layer, seals the passivation layer; and
- (f) forming an ohmic contact of an electrically conductive material over said second portion of the cap layer, comprising the substeps of:
- (g) forming a mask over said antireflection coating such that a lateral gap is provided between the mask and said second portion of the cap layer;
- (h) forming an ohmic contact material over the mask, over the portion of the antireflection coating in said gap, and over said second portion of the cap layer; and
- (i) lifting off the mask and said contact material overlying the mask.

12. A method as in claim 11, in which step (e) comprises the substeps of:
- (g) forming a mask over said second portion of the cap layer;
- (h) forming said insulative material over said exposed portion of the passivation layer and the mask; and
- (i) lifting off the mask and said insulative material overlying the mask.

13. A method as in claim 11, in which the antireflection coating directly contacts the periphery of the second portion of the cap layer.

* * * * *